United States Patent [19]

Satterfield et al.

[11] Patent Number: 4,957,146
[45] Date of Patent: Sep. 18, 1990

[54] FLATPACK PREPARATION MACHINE

[75] Inventors: Nathaniel J. Satterfield, Anderson, S.C.; J. Gregg Ellis, Indian Harbour Beach; Leonard T. Hesch, Jr., Palm Bay, both of Fla.

[73] Assignee: Harris Corporation, Melbourne, Fla.

[21] Appl. No.: 319,036

[22] Filed: Mar. 6, 1989

[51] Int. Cl.$^5$ ............................................. B21F 45/00
[52] U.S. Cl. ...................................... 140/105; 140/147
[58] Field of Search .................................. 140/105, 147

[56] References Cited

U.S. PATENT DOCUMENTS

| | | | |
|---|---|---|---|
| 3,404,712 | 10/1968 | Suverkropp | 140/147 |
| 3,796,201 | 3/1974 | Golub | 140/105 |
| 4,103,718 | 8/1978 | Steigerwald | 140/105 |
| 4,397,341 | 8/1983 | Kent | 140/147 |
| 4,643,234 | 2/1987 | Alemanni | 140/147 |

*Primary Examiner*—Lowell A. Larson
*Attorney, Agent, or Firm*—John L. DeAngelis, Jr.

[57] ABSTRACT

A flatpack lead forming, cutting, and straightening machine. The flatpack is unloaded from the carrier and aligned for later processing by its leads, rather than the body portion. The first processing step forms the lead by bending them downwardly against an anvil, and then bending them outwardly to form the foot. The leads are cut by an upwardly-moving cutter to prevent downward flagging of the leads. The flatpack is then placed between two vertically mounted plates such that one set of plates contacts a pair of leads disposed on opposite sides of the flatpack body. The plates are moved upwardly and downwardly to flex the leads and remove the set therein. Adjacent lead pairs are flexed 180 degrees out of phase in this process. The formed, cut, and straightened flatpack is then loaded into a handling tube for storage or transport to the assembly area. A transport mechanism transports the flatpack from each stage of the process to the next stage.

10 Claims, 15 Drawing Sheets

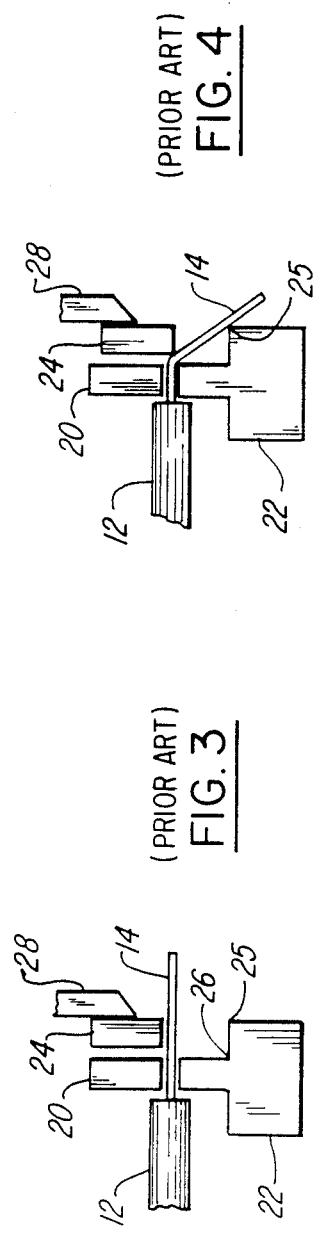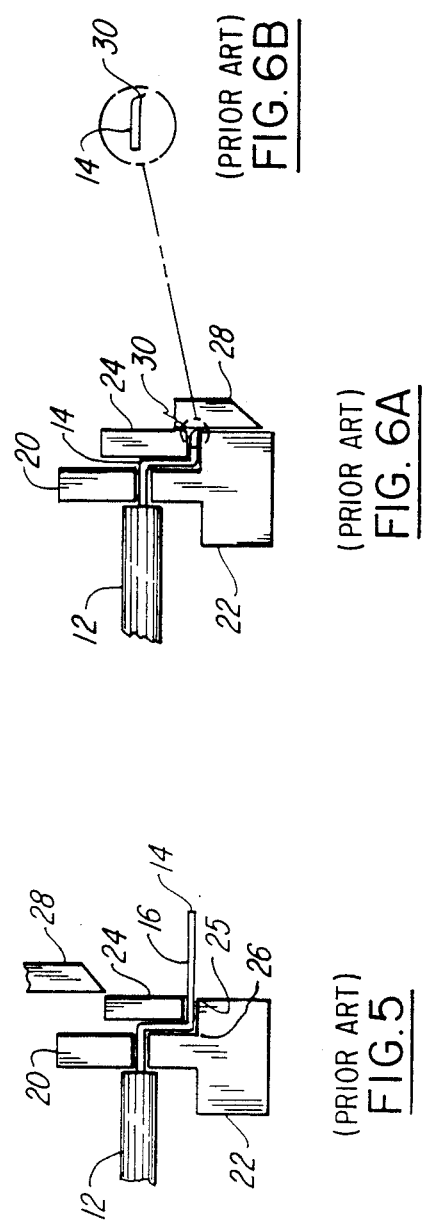

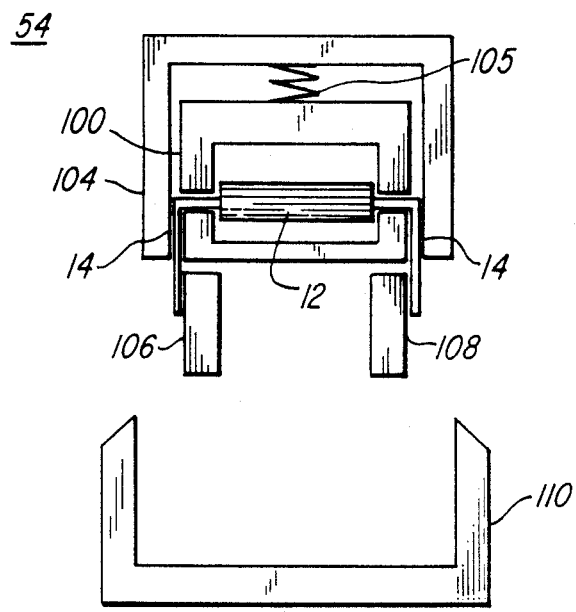
FIG.13
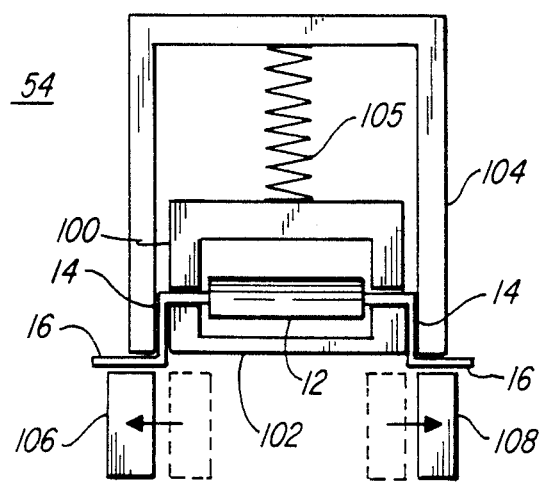
FIG.14
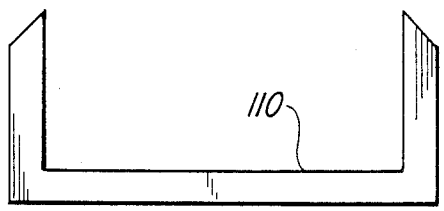

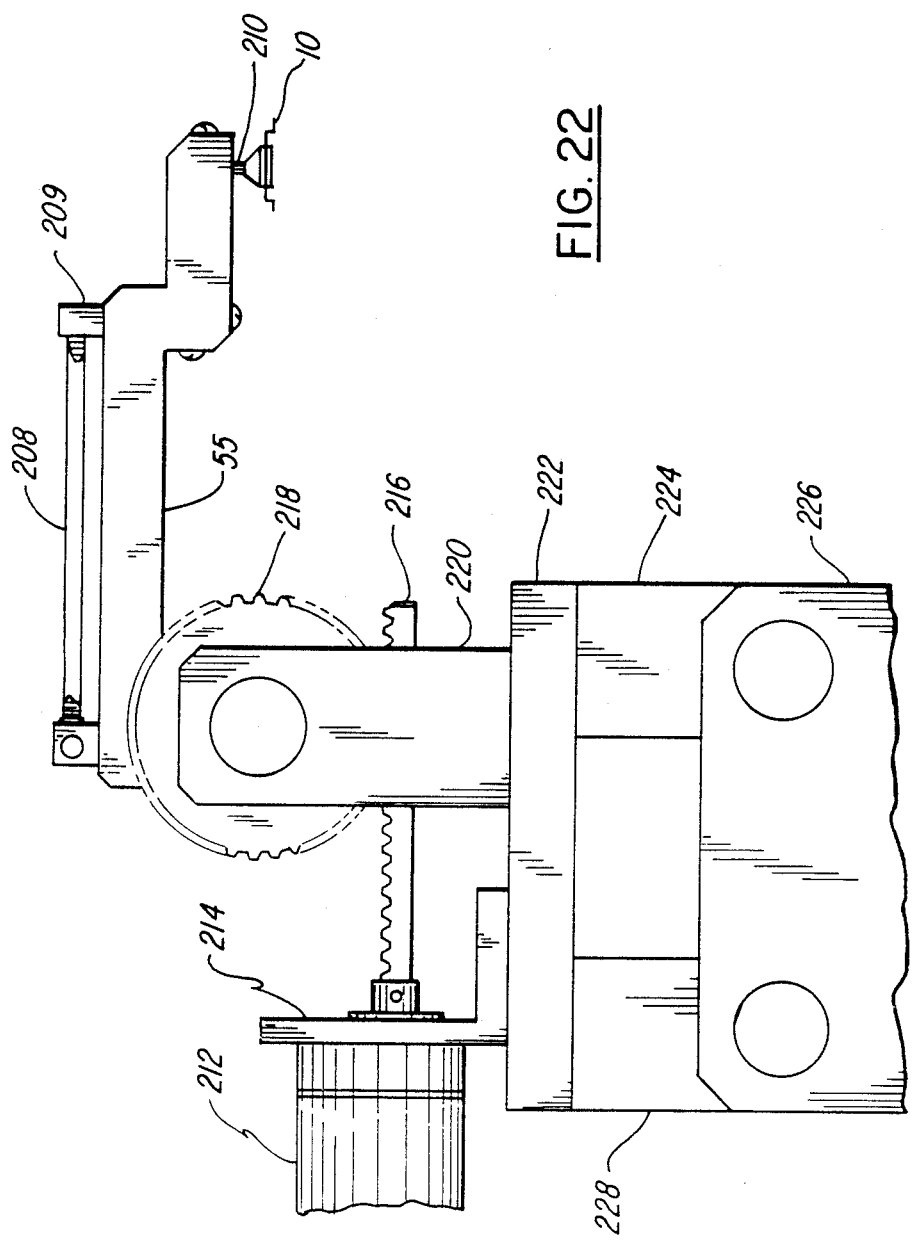

FLATPACK PREPARATION MACHINE

FIELD OF THE INVENTION

This invention relates to a machine for preparing flatpack integrated circuit packages for soldering to a printed circuit board.

BACKGROUND OF THE INVENTION

The demand for high-density, cost-effective printed circuit boards has prompted the electronics industry to seek alternative methods to traditional plated-through-hole technologies. One such alternative is surface mounting, a technology in which the components have leads that allow soldering to a surface of the printed circuit board, without the necessity of using plated-through holes. Surface mounting is a cost effective technology because it offers higher density component placement on the printed circuit board.

One such surface mounted component is illustrated in FIGS. 1 and 2. FIG. 1 is a top view of a flatpack component 10, including a body 12 and leads 14. FIG. 2 shows the flatpack 10 in a side elevation after the leads 14 have been shaped to form a foot 16 in preparation for soldering to a printed circuit board.

In preparing the flatpack leads it is critical that the foot 16 of each lead 14 be in the same plane so that when the flatpack 10 is placed on the printed circuit board each lead contacts a solder pad for later soldering. It is also critical for each of the leads to be properly positioned in the X-Y direction, i.e., the distance from the flatpack body to the foot 16 and the distance between the leads 14. Again, this ensures that each lead 14 contacts the proper pad on the printed circuit board. If the leads 14 are not properly positioned when the flatpack 10 is applied to the printed circuit board, the soldering operation may produce cold solder joints or bridges between the leads 14 and/or the pads on the printed circuit board. Also, an improperly positioned flatpack could subject the solder joints to undue stresses that may eventually cause the joint to crack, creating an open circuit. For systems designed to MIL-SPEC DOD 2000 standards, there is also a tolerance requirement for placement of the foot 16 on the pad relative to the dimensions of the pad.

FIGS. 3 through 6 illustrate the prior art technique for forming and cutting the flatpack leads 14. FIG. 3 shows the body 12 and the leads 14 extending horizontally therefrom; this is the configuration in which the flatpack is received from the fabrication process. The lead 14 is held between a clamp 20 and a forming anvil 22. A blade 24, driven by a cylinder not shown in FIG. 3, moves downwardly against the lead 14 to form the lead 14, as shown in FIGS. 4 and 5. In FIG. 4 the downward progress of the lead 14 stops when the lead 14 strikes a corner 25 of the forming anvil 22. In fact, the lead 14 is scratched when it strikes the corner 25 resulting in some metal removal. At this point, as the blade 24 continues to move downwardly the lead 14 conforms to the shape of the corner 26 within the forming anvil 22. This process of forming the lead 14 against the forming anvil 22 produces coining in the lead 14. Coining is a stretching or a reduction in lead thickness caused when the blade 24 stretches the lead 14 as it is made to conform to the shape of the corner 26. As is known by those skilled in the art, this coining produces unnecessary residual stresses in the lead 14 that may cause the lead 14 to break while it is being soldered in place or, even worse, during its service life. When the flatpack is soldered in place, these residual stresses in the lead also place undue stresses on the solder joint itself. Thus, one of the objects of the present invention is to overcome this disadvantage by providing a two-stage forming process that does not produce coining of the leads 14.

After the lead 14 has been properly shaped a cutting blade 28 moves downwardly (See FIG. 6) to cut the excess material from the lead 14. This prior art process may result in downward flagging of the lead 14, where a small portion of the lead 14 is bent downwardly during the cutting operation. Flagging is especially prevalent when the cutting blade 28 is dull, as dull blade drags the metal down instead of making a clean cut. The flagged portion is identified by reference character 30 in FIG. 6A, and can be seen in the close-up view of FIG. 6B. When a flatpack 10 cut in accord with the prior art is laid upon a printed circuit board for soldering, the flagged portion 30 prevents the entire foot 16 from contacting the printed circuit board trace, thus resulting in a weak solder joint. Because this prior art forming and cutting process requires only one step (i.e., the blade 24 and cutting blade 28 can be driven downwardly simultaneously in a single step), it is simple and thus inexpensive to implement. The present invention, although more complex, produces a vastly improved final product.

SUMMARY OF THE INVENTION

The flatpack preparation machine of the present invention offers an efficient and accurate technique for preparing the flatpack integrated circuit that overcomes the disadvantages of the prior art devices discussed above. Specifically, the present invention forms, straightens, and cuts the flatpack leads prior to installation on the printed circuit boards in such a way to avoid lead coining and downward flagging and provide a more accurate lead configuration.

The present invention is a multi-step machine that first aligns the flatpacks by their leads (instead of by the body, because the leads may not be exactly perpendicular to the body) to prevent form run-out, in which the outline of the flatpack footprint is formed into a rhombus, rather than a rectangle; that is, the leads are not set perpendicular to the body during component manufacturing. This causes the footprint of the component to mismatch the pattern on the printed circuit board. Next the flatpack is processed through a two-stage forming process that provides "true bending" of the leads 14. This stage differs from the prior art forming systems where the flatpack undergoes forming and cutting operations that result in coining of the flatpack leads, as discussed above. After forming the leads, the excess lead material is trimmed upward in the present invention, instead of downward as taught by the prior art. This removes the possibility of downward flagging on the flatpack leads, which will create small downwardly-shaped lead edges that may prevent the lead from laying flat on the printed circuit board and the possibility of a weak solder joint. The leads are then straightened, by cold working them slightly, to ensure lead planarity. Lead planarity is critical to the successful completion of the remaining process steps. After the straightening operation, the flatpacks are loaded into handling tubes, and are then ready for use in the circuit assembly operation. One key feature of the present invention is the accomplishment of all of these steps automatically so that the flatpacks do not require human handling. The present invention significantly increases process throughput and improves final product quality, while reducing rework caused by leads that are not coplanar and limiting personnel handling requirements. While the invention is described with reference to flatpacks, it can be used to process any integrated circuit package that has leads extending in one plane therefrom.

BRIEF DESCRIPTION OF THE DRAWINGS

The present invention may be better understood and the further uses and advantages thereof more readily apparent, when considered in view of the description of the preferred embodiments and the following figures in which:

FIGS. 3 through 6B illustrate a prior art technique for forming and cutting the leads of the flatpack illustrated in FIGS. 1 and 2;

FIGS. 12 through 16 illustrate the forming and cutting stage of the flatpack processing machine illustrated in FIG. 7;

FIGS. 21 and 22 illustrate the transport stage of the flatpack processing machine illustrated in FIG. 7.

DESCRIPTION OF THE PREFERRED EMBODIMENTS

Figure 1:
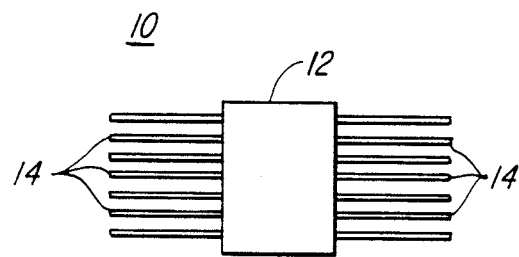
FIGS. 1 and 2 illustrate a prior art flatpack integrated circuit.
Figure 2:
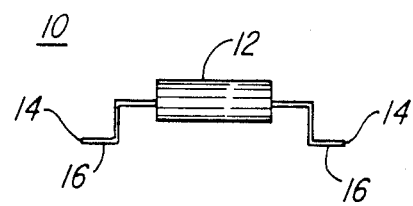
Figure 7:
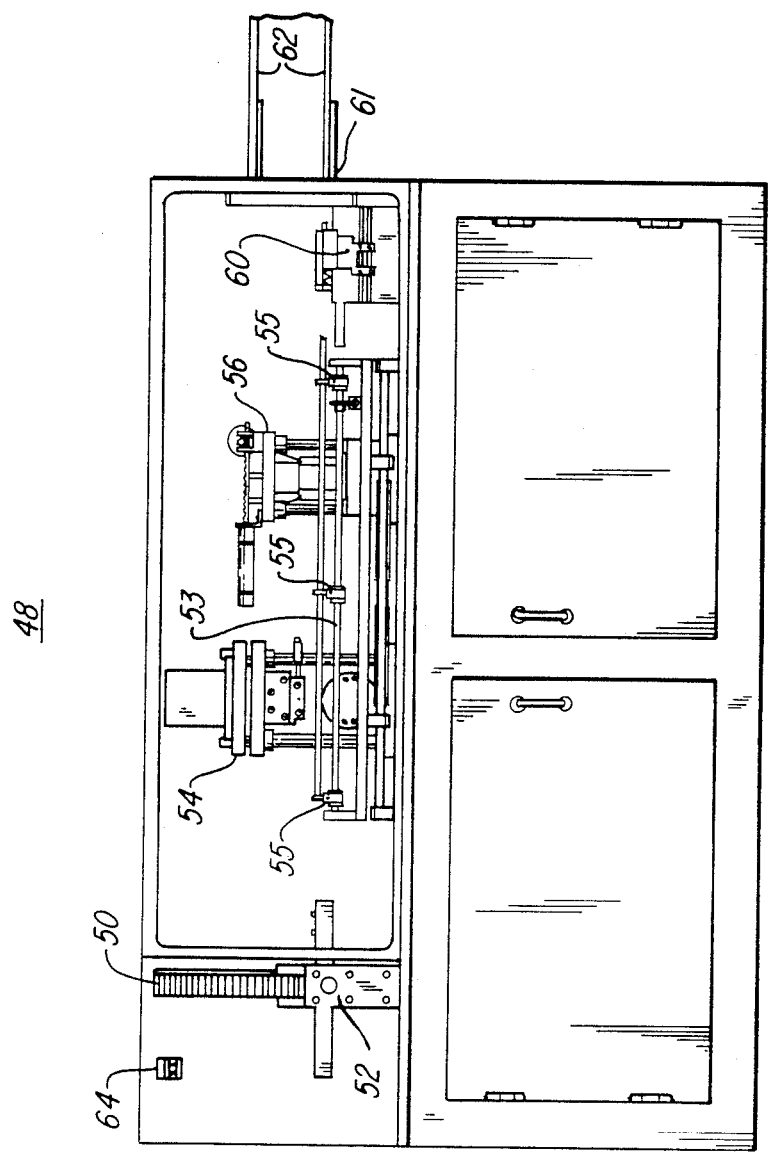
FIG. 7 illustrates the flatpack preparation machine of the present invention.

FIG. 7 illustrates a flatpack preparation machine 48 constructed according to the teachings of the present invention and embodying the various stages that will be discussed further herein below. A vendor shipping tube 50 contains a plurality of flatpacks 10 with leads 14 protruding horizontally from the body 12, as shown in FIG. 1. Each of the flatpacks 10 is attached to a carrier 80 that holds the leads in place during shipping, but is removed prior to mounting to a printed circuit board. The flatpack preparation machine 48 removes the flatpack 10 from the vendor shipping tube 50 and the protective carrier 80, shapes and cuts the leads 14 in three separate stages, coplanarizes the leads 14, then loads the flatpacks 10 into a handling tube for transportation to the assembly area. There the flatpack 10 is mounted and soldered to a printed circuit board.

To begin the process, the vendor shipping tube 50 is inserted by hand into an unloader 52 where the flatpack 10 is unloaded, separated from the carrier, and properly aligned using the leads 14 as the alignment reference. A transporter 53 then moves the flatpack 10 from the unloader 52 to the former 54. At this stage the leads 14 are formed and cut to create the foot 16. The transporter 53 then moves the flatpack 10 to the straightener 56 where the leads are straightened to be sure that all the feet 16 are in the same plane. In this way when the flatpack 10 is placed on the printed circuit board each lead 14 will properly contact its respective pad on the board. Lastly, the transporter 53 moves the flatpack 10 to a loader 60 for loading into a flatpack handling tube 62. This process is repeated until the handling tube 62 is filled with formed components. At this time a shuttle 61 automatically moves the full handling tube 62 out of the loading position and replaces it with an empty handling tube 62, thus providing continuous operation. An operator then replaces the full handling tube with an empty one. The flatpack handling tube 62 is removed by hand from the flatpack preparation machine 48 and the flatpacks 10 are ready for soldering to a printed circuit board. A counter 64 is set equal to the number of flatpacks 10 in the vendor shipping tube 50 so that the flatpack preparation machine 48 cycles through the correct number of operations before the shuttle 61 is activated to replace the full handling tube with an empty one.

Figure 8:
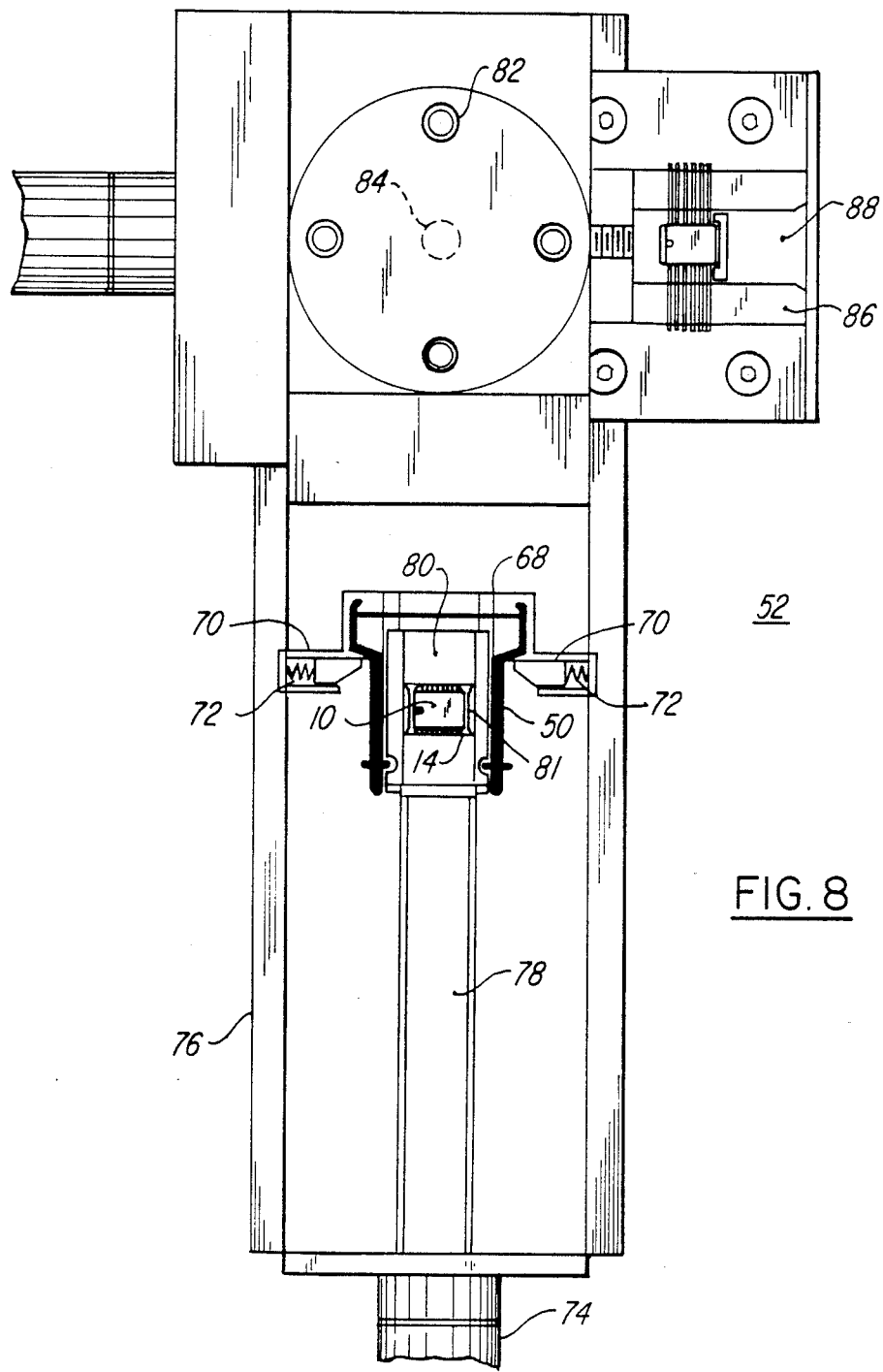
FIGS. 8 through 11 illustrate the unloading stage of the flatpack processing machine illustrated in FIG. 7.

The unloader 52 is shown in more detail in FIG. 8. The vendor shipping tube 50 is mounted in a frame 68 and held in place by two fingers 70 urged against each side of the vendor shipping tube 50 by the force of springs 72. A cylinder 74 mounted on a frame 76 includes a ram 78 that moves forward to singulate one flatpack 10 and its associated carrier 80 from the plurality of vertically-loaded flatpacks 10. The forward movement of the ram 78 drives the flatpack 10 and its associated carrier 80 beneath a cylinder 82. The cylinder 82 includes a ram 84 that is shown in a virtual representation in FIG. 8. The ram 84 moves vertically downward striking a carrier clip 81 and causing the flatpack 10 to separate from the carrier 80. The flatpack 10 falls onto a slide 86 (see FIG. 9) while the carrier clip 81, being smaller, falls through the opening 88 in the slide 86. The empty carrier 80 is expelled from the carrier when the next flatpack 10 is singulated.

Figure 9:
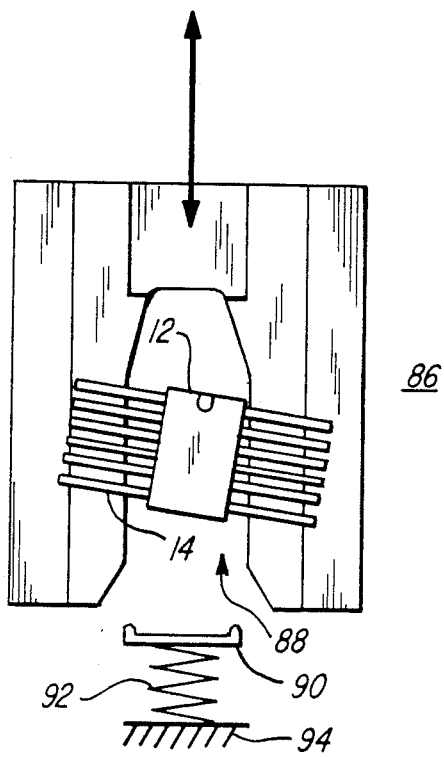
Figure 10:
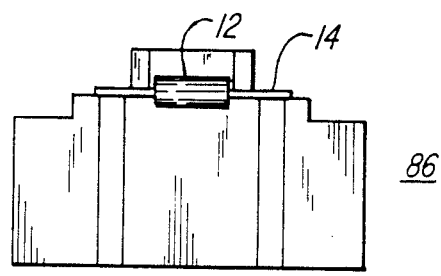
Figure 11:
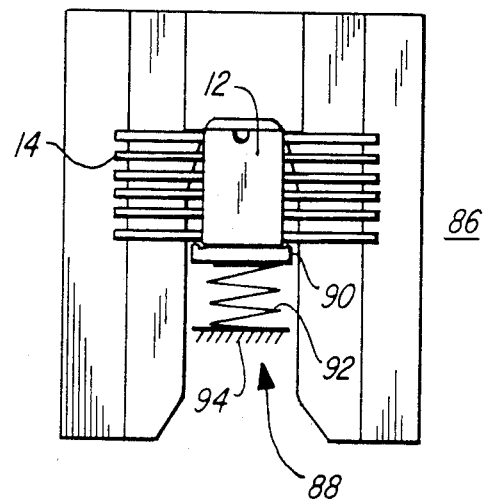

A closeup view of the slide 86 is illustrated in FIG. 9. FIG. 10 presents an end view of the slide 86. The arrow in the top portion of FIG. 9 illustrates that the slide moves inwardly and outwardly from beneath the cylinder 84. After the flatpack 10 is separated from the carrier 80 the flatpack 10 falls downwardly and lands on the slide 86. Usually the flatpack 10 will come to rest in a configuration where the leads 14 are not perpendicular to the edges of the slide 86, such as the orientation shown in FIG. 9. After the flatpack 10 has come to rest, the slide 86 begins moving forward until the flatpack 10 strikes an alignment member 90 biased by a spring 92. The spring is rigidly attached to a mounting point 94 on the frame 76 (see FIG. 9). Once the flatpack 10 strikes the alignment member 90 (see FIG. 11) the orientation of the flatpack 10 is changed so that the leads 14 are perpendicular to the slide 86. Note that the alignment member 90 aligns the flatpack 10 based on the orientation of the leads 14, and not by the body 12. That is, the alignment member 90 strikes the two leads 14 in the foreground as the slide 86 moves forward toward the alignment member 90. The alignment of the flatpack 10 on the slide 86 by the leads 14 ensures that subsequent process steps will accurately form and cut the leads 14. In many cases, the flatpack body 12 is not properly aligned with the leads 14 during component manufacture, so that alignment based on position of the body 12 will result in inaccuracies in subsequent stages of the process. At the conclusion of the unloading process the flatpack 10 is properly aligned with pin 1 facing upstream.

The transporter 53, includes three pickup arms 55 that simultaneously pickup the flatpack 10 from the previous stage in the process and deliver the flatpack 10 to the next stage. Each pickup arm 55 includes a suction cup and is connected to a vacuum pump for drawing a vacuum in the suction cup area to hold the flatpack 10 in place during the transport operation. The transporter 53 will be discussed in greater detail in conjunction with FIG. 22.

When the flatpack 10 is picked up by a pickup arm 53 from the slide 86, the orientation of the flatpack 10 is not changed. In this way, when the flatpack 10 arrives at the former 54 the leads 14 are properly oriented with respect thereto. As discussed above, this advantageous feature is due to the alignment of the flatpack 10 by the leads 14, rather than by the body 12.

Figure 12:
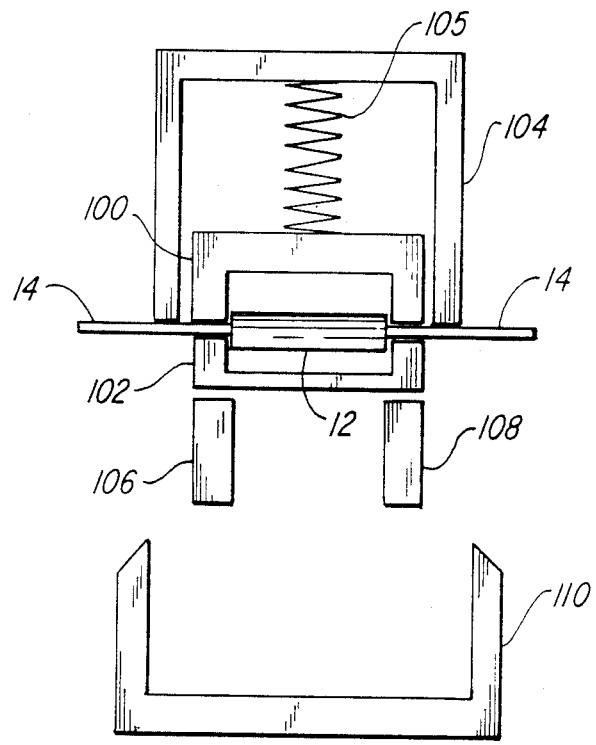

FIG. 12 is a detailed illustration of the former 54 where the flatpack 10 undergoes a two stage forming process. This process produces true bending of the leads, rather than the lead coining taught by the prior art. Also, throughout the entire process the flatpack 10 is aligned by the leads 14, rather than the body 12. To provide strain relief, the leads 14 are held at a point near the body 12 to prevent stress from occurring at the junction of the body 12 and the leads 14.

Referring to FIG. 12, the leads 14 are held by a clamp 100 and a forming anvil 102. During the first step of the forming process, the clamp 100 and a forming member 104 are driven downwardly against the leads 14 on both sides of the body 12 by a single stroke of a cylinder ram, not shown in FIG. 12. The forming member 104 is spring biased against the clamp 100 by a spring 105 so that the clamp 100 contacts and holds the leads 14 before the forming member 104 begins to bend the leads 14. As can be seen in FIG. 13, the downward movement of the forming member 104 bends the leads 14 against the forming anvil 102. In the next step of the process, forming members 106 and 108 move outwardly as shown in FIG. 14 to create the foot 16 extending horizontally on each of the leads 14. Both of these bending steps are true bending processes where bending occurs only at one point or line and stresses are induced only in the bend. In this true bending operation one end of the lead 14 is clamped firmly against one of the forming anvils, while the other end is unobstructed as it is formed about the anvil. Thus the only stresses induced in the lead 14 are those produced by the bending operation. In the prior art coining processes, stresses are induced throughout the entire lead, weakening the material and reducing service life.

Figure 15:
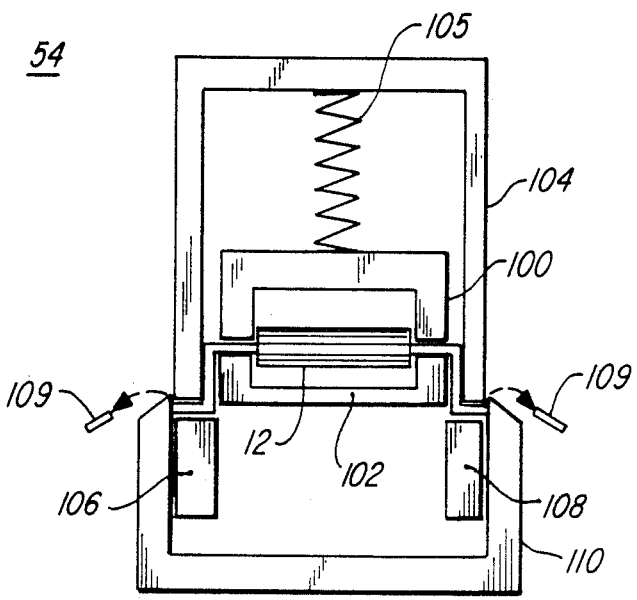

FIG. 15 illustrates the upward movement of a cutter 110 for cutting a portion of the foot 16. The severed portions are identified by reference character 109. As discussed above, the prior art downward cutting often produces downward flagging at the end of each lead, especially when the cutter is dull. Under these circumstances the cutter drags the metal downwardly rather than cutting cleanly immediately upon contact with the lead 14. Downward lead flagging creates a severe solderability problem because the lead 14 will not set flatly down on the printed circuit board, but instead will be slightly elevated from the circuit board surface due to the flagged portion. This problem does not occur in the present invention where the cutting is done with an upward motion.

Figure 16:
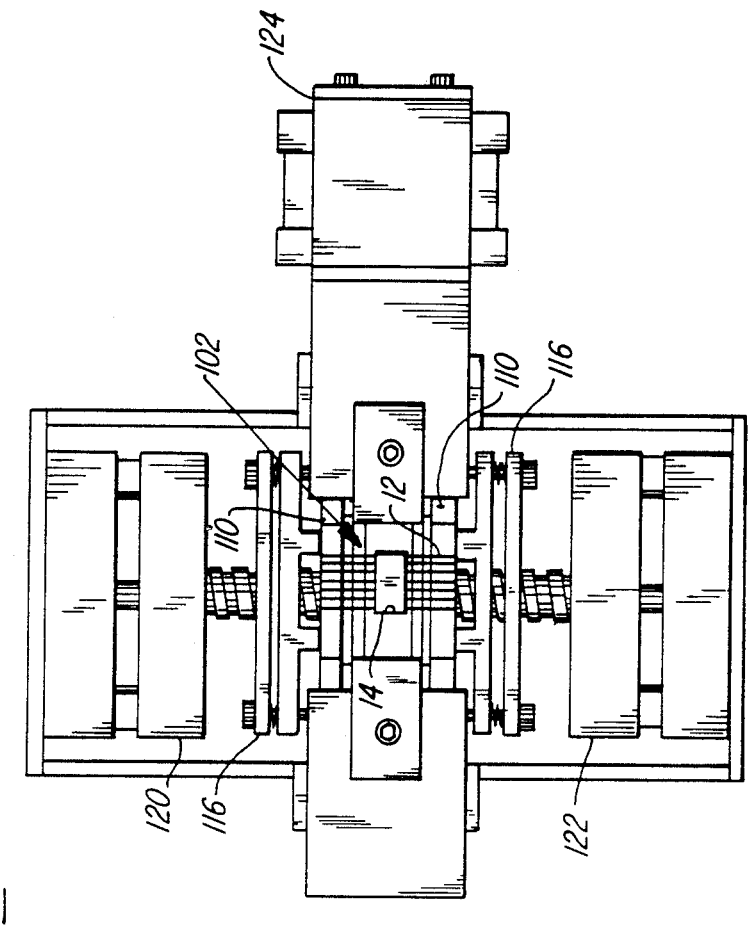

Several elements of the former 54 are also illustrated in FIG. 16. This figure is a top view of the bottom elements of the former 54 and clearly shows the flatpack body 12 and leads 14. Also illustrated is the forming anvil 102 and the cutter 110. Spring plates 116 are used to ensure accurate lead cutting by applying appropriately directed forces against the cutter blades 110.

Cylinders 120 and 122 move the forming members 106 and 108, respectively. A cylinder 124 controls movement of the clamp 100 and the forming member 104.

When the forming operation is complete the forming members 104, 106, and 108, and the cutter 110 simultaneously return to their initial positions. The flatpack 10 is then picked up by the pickup arm 53 and transported to the straightener 56.

Most metals, including the leads 14, exhibit springback or memory effects. That is, after such a metal is bent slightly, it will spring back slightly or try to return to its former shape. If the leads 14 are not coplanar when the flatpack 10 is removed from the carrier 50, the leads will likely retain this lack of coplanarity after the unloading, forming, and cutting steps. Even after the leads are clamped in the former 54, they will likely spring back to a resemblance of their former position after the cutting process is complete. The amount of variation from the desired plane may differ for each one of the leads 14, and each may vary in the amount of spring back it experiences after removal from the clamps of the former 54. Although the forming and cutting operations of the present invention tend to reduce the lack of coplanarity as compared to the prior art forming process, any remaining variations are still unacceptable and must be removed. It is the objective of the straightener 56 illustrated in FIGS. 17, 18, and 19 coplanarize the leads 14.

Figure 17:
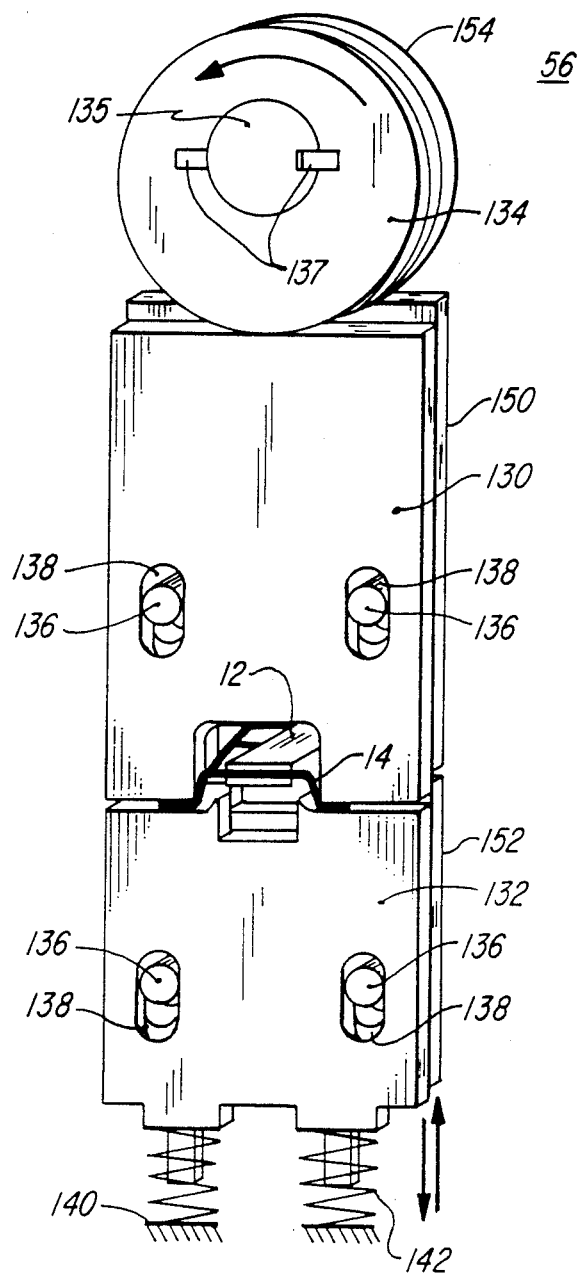
FIGS. 17 though 19 illustrate the straightener stage of the flatpack processing machines illustrated in FIG. 7.

FIG. 17 is a partial view of the straightener 56 including a top plate 130 and a bottom plate 132 for clamping the first pair of leads 14 as shown. The up/down vertical movement of the plates 130 and 132 is controlled by a series of circular offset cams 134 which are alternately 180° out of phase and are rotated by a cam shaft 135. Movement of the plates 130 and 132 is constrained by pins 136 located in slots 138 biased by springs 140 and 142. As the cam 134 rotates the plates 130 and 132 move vertically to flex the first pair of leads 14 of the flatpack 10. This flexing cold works the leads 14 slightly to remove the memory or spring back. Behind the plates 130 and 132 are plates 150 and 152, respectively. The plates 150 and 152, under control of a cam 154 behind the cam 134 and also affixed to the cam shaft 135, flex the second pair of leads 14. The first pair of leads 14 flexed by the plates 130 and 132 move in opposite direction to the second pair of leads 14 flexed by plates 150 and 152. That is, the cams 134 and 154 are oriented so that as the first pair of leads 14 moves downwardly the second pair of leads 14 moves upwardly. The flexing action produced by the plates 150 and 152 cold works the second pair of leads 14 slightly to also remove the memory therefrom. Although not shown in FIG. 17, the straightener 56 includes a plurality of parallel mounted plates, like the plates 150 and 152, driven by a cam connected by a cam shaft 135 that flex the other pairs of leads 14 of the flatpack 10. Thus each pair of leads is flexed upwardly and downwardly, for approximately five cycles in one embodiment, to remove the springback. In the prior art this straightening process is done manually by visually inspecting each lead and aligning to a predetermined plane.

Figure 18:
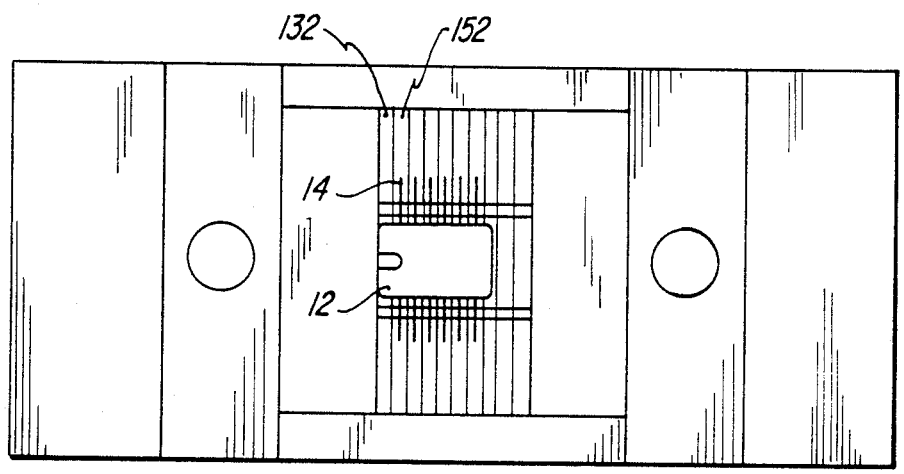

FIG. 18 is a top view of the straightener 56 with the top plates 130 and 152 removed. It can be observed that each of the leads 14 sets atop a plate 132, or a plate 152, or plates similar and parallel thereto. Accurate placement of the flatpack 10 on the plates is accomplished by the repeatability achieved by the transport system 53.

Figure 19:
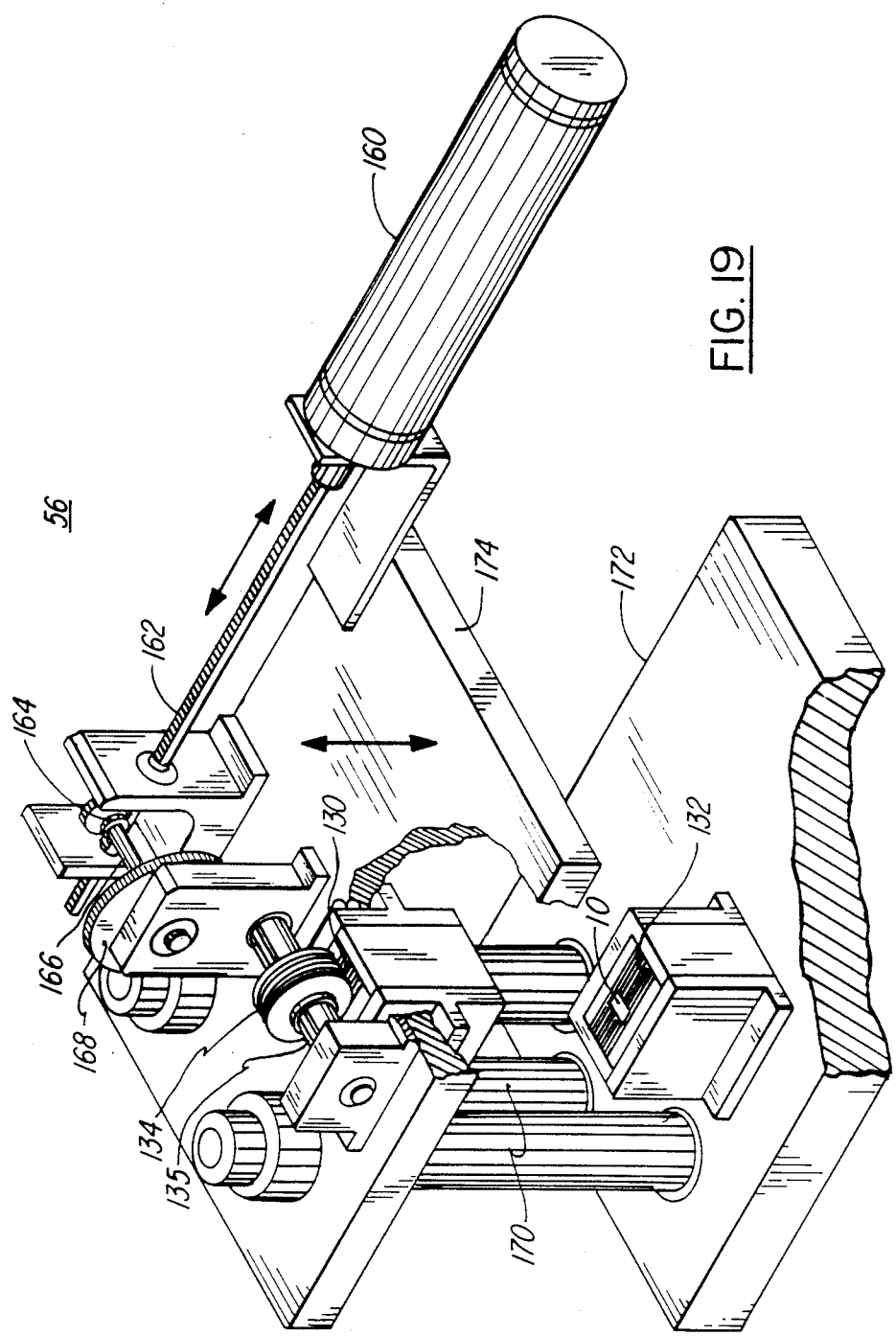

FIG. 19 illustrates the straightener 56 in more detail. The straightener 56 includes a cylinder 160 driving a linear motion rack 162 to turn a gear 164. Rotation of the gear 164 drives a shaft 166 and a gear 168 attached thereto. The gears 168 in conjunction with a third gear hidden from view in FIG. 19, serve as a gear reducer that drives the cam shaft 135. As discussed above, rotation of the cam shaft 135 turns the cams 134 for moving the plates 130, 132, 150, and 152 and the plates mounted parallel thereto. In one embodiment each of the cams 134 is circular in shape and includes an offset center hole therein. The cams 134 are mounted on the cam shaft 135 in such a way that adjacent cams 134 are 180 degrees out of phase rotation with each other. In this way, when one cam is urging the plate 130 downwardly, the adjacent cam is allowing the adjacent plate to move upwardly. In one embodiment the cam shaft 135 rotates at the approximate rate of one rotation every 0.2 seconds and provides five to ten rotational cycles to the cams 134 to accomplish the lead straightening.

After the flatpack 10 has been placed upon the lower plates 132, as shown in FIG. 19, a cylinder 170 mounted on a bottom platen 172 is activated to lower a top platen 174 downwardly. This motion brings the top plates 130 into contact with the leads 14 as shown in the FIG. 17 representation. At this point the cylinder 160 is activated and the straightening process begins as described above.

Figure 20:
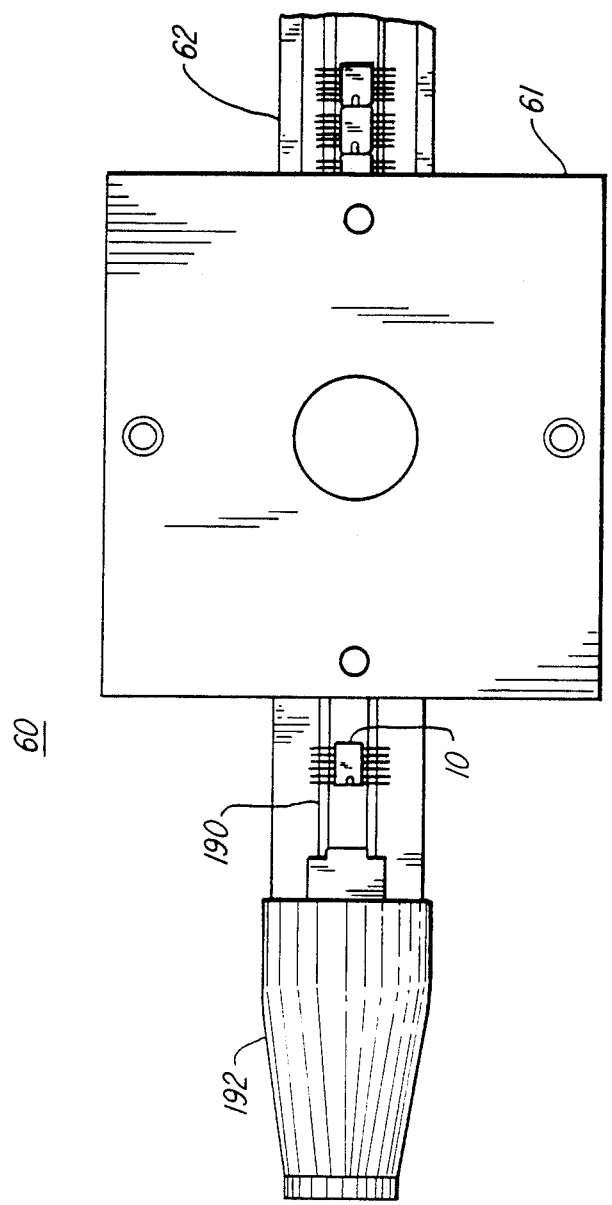
FIG. 20 illustrates the handling tube loading stage of the flatpack processing machine illustrated in FIG. 7.

After the leads 14 have been straightened in the straightener 56, the transport 53 places the formed and straightened flatpack 10 onto a loading rail 190 of the loader 60. See FIG. 20. The loader 60 includes a cylinder (not shown) for driving a loading ram 192 that pushes the flatpack 10 into the handling tube 62. Hen the handling tube 62 is full, a new tube is moved into place under control of the loader shuttle 61. The operator then replaces the full handling tube 62 with an empty handling tube. Under control of the counter 64, the shuttle 61 moves in and out of the loading area of the loader 60 as a handling tube 62 becomes full, thereby providing continuous reloading until all flatpacks in the machine 48 have been processed (see FIG. 7). Placement of the finished flatpack 10 in the handling tube 62 protects the lead form integrity.

Figure 21:
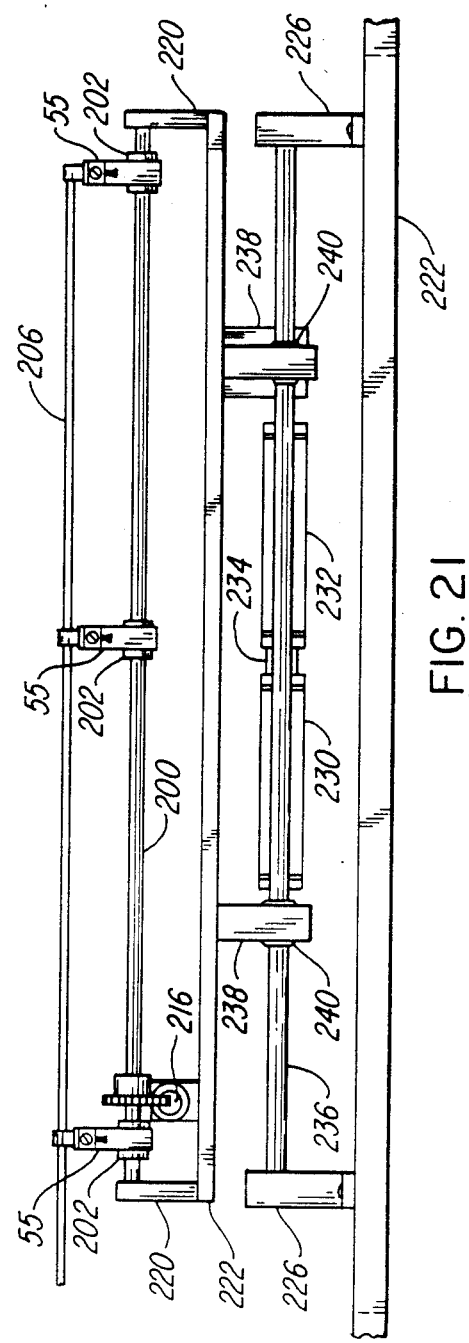

FIGS. 21 and 22 are detailed front and end views, respectively, of the transport 53. Referring to FIG. 21, the three pickup arms 55 are connected by shaft 200. The shaft 200 is attached to each pickup arm through a collar 202. A vacuum is drawn through a vacuum line 206 connected to each pickup arm 55 for picking up the flatpack 10 from each of the unloader 52, the former 54, and the straightener 56, and delivering the flatpack 10 to the next processing stage. Referring to FIG. 23, the vacuum line 206 is connected to tubing 208 and a fitting 209 at the site of each pickup arm 55 for providing the vacuum thereto. The vacuum orifice is located within a pickup 210, see FIG. 22, where the flatpack 10 is held when the vacuum is drawn.

FIG. 22 also illustrates the mechanism by which each pickup arm 55 is rotated downwardly to pickup the flatpack 10 after the processing steps have been completed. A cylinder 212 held in place by a mounting bracket 214 activates a rack 216 for turning a gear 218. Rotation of the gear 218 turns the shaft 200 thereby rotating each of the pickup arms 55 downwardly to pick up the flatpack 10 after the processing step has been completed. The gear 218 is held in place by plates 220, 222, 224, 226, and 228 as illustrated in FIG. 21.

Horizontal movement of the transport 53 and the flatpacks 10 held thereby is accomplished under control of cylinders 230 and 232. See FIG. 21. The cylinders 230 and 232 are coupled via a coupler 234 to a shaft 236. The shaft is attached to blocks 238 by linear bearings 240. Activation of the cylinders 230 and 232 moves the shaft 236 horizontally within the linear bearings 240. Since the blocks 238 are attached to the shuttle plate 222, the entire transport assembly, including pickup arms 55, moves in response thereto. Once the pickup arms 55 have arrived at the next stage, activation of the cylinder 212 in FIG. 21 moves the pickup arms 55, downwardly and the vacuum is released to set the flatpacks 10 down at the next stage. The cylinder 212 is again activated to rotate the pickup arms 55 upwardly after which the cylinder 232 is activated to move the shaft 236 and its attachments back to the initial configuration. After each step of the process is completed the transport 53 cycles through these steps to pickup, move, and set down the flatpacks 10.

In one embodiment, the flatpack preparation machine 48 can accommodate today's 14 and 16 pin flatpacks. In addition, the invention is also extendable, as will be realized by those skilled in the art, to larger and more complex flatpacks with 256 leads (or more) at 0.020 mil spacing (or less).

While the present invention has been described with reference to a flatpack, it is recognized by those skilled in the art that the teachings of the invention are easily extendable beyond the typical flatpack configuration. In the art, the flatpack is defined as a device with two rows of leads extending from the body in a plane. Other types of packages that may be formed with this machine include quad- packs, large-scale integrated circuits, and after-market lead attachment configurations. Other hybrid and special components with two rows of leads extending in one plane from the body can also be advantageously processed with the present invention. Basically, this invention can be used with any package with leads extending from the body in a plane (whether those leads extend from one or more sides of the body), where the leads have to be formed from the original plane into one or more other planes.

Although we have shown and described embodiments in accordance with the present invention, it is understood that the present invention is not limited thereto but is susceptible of numerous changes and modifications as known to a person skilled in the art. We therefore do not wish to be limited to the details shown and described herein, but intend to cover all such changes and modifications as are obvious to one of ordinary skill in the art.

WHAT IS CLAIMED IS:

1. A process for forming the leads of an integrated circuit having a body and a plurality of leads extending therefrom, including the steps of:
   (a) clamping each lead between the body and the lead portion to be formed;
   (b) bending each lead downwardly to form a first lead segment forming an angle of between approximately 45 degrees and approximately 90 degrees with the body;
   (c) for each lead, bending a portion of the first lead segment outwardly to form an approximately horizontal second lead segment; and
   (d) cutting each lead vertically upward to remove a predetermined portion of said second lead segment.

2. The process of claim 1 wherein the bending in steps (b) and (c) is a true bending process.

3. A forming machine for forming the leads of an integrated circuit having a body and a plurality of leads extending therefrom, said forming machine comprising;
   clamp means for clamping each lead of the integrated circuit proximate the body between the body and the lead portion to be formed;
   first forming means having a downward movement for bending each lead downwardly to form a first lead segment forming an angle of between approximately 45 degrees and approximately 90 degrees with the body;
   second forming means moving outwardly against each first lead segment for bending a portion of said first lead segment outwardly to form an approximately horizontal second lead segment; and
   cutting means for moving vertically upwards to remove a predetermined portion of each of said second lead segments.

4. A machine for straightening the leads of an integrated circuit having a body and a plurality of leads extending therefrom, said machine comprising:
   a plurality of lower plates equal in number to the plurality of leads;
   a plurality of upper plates equal in number to the plurality of leads;
   wherein the integrated circuits is placed between said upper and said lower plates with each lead between one of said upper and lower plates;
   means for moving said upper and said lower plates vertically upwardly and downwardly so as to flex the leads to remove the set therein.

5. The machine of claim 4 wherein alternate leads are flexed 180° out of phase.

6. A machine for straightening the leads of an integrated circuit having a body and a plurality of leads extending therefrom, comprising:
   a shaft;
   means for rotating said shaft;
   for each pair of leads disposed on opposite sides of the body, a cam attached to such shaft;
   for each pair of leads disposed on opposite sides of the body, a first plate in contact with said respective cam;
   for each pair of leads disposed on opposite sides of the body a second plate biased in the direction of said first plate;
   wherein the integrated circuit is placed between said first and said second plates in such a way that each lead is held between said first and said second plates;
   wherein the rotation of said shaft rotates said cams and causes said first plate to move against the bias applied to said second plate, thereby flexing the lead; and
   wherein said cams are oriented to flex adjacent lead pair 180° out of phase; and
   wherein continued rotation of said shaft rotates said cam allowing said first plate to move in response to the bias applied to said second plate and wherein a plurality of rotational cycles of said shaft flexes each lead to remove the set therein.

7. A process for forming and straightening the leads of a flatpack integrated circuit having a body and a plurality of leads extending therefrom, including the steps of:
   clamping each lead between the body and the lead portion to be formed;
   bending each lead downwardly to form a first lead segment forming an angle of between approximately 45 degrees and approximately 90 degrees with the body;
   for each lead, bending a portion of the first lead segment outwardly to form an approximately horizontal second lead segment; and
   cutting each lead vertically upward to remove a predetermined portion of said second lead segment;
   flexing each lead vertically upwardly and downwardly through a plurality of cycles to remove the set therein and planarize the plurality of leads.

8. A flatpack preparation machine for forming and straightening the leads of a flatpack integrated circuit having a body and a plurality of leads extending therefrom, said flatpack preparation machine comprising:
   clamp means for clamping each lead of the flatpack integrated circuit proximate the body between the body and the lead portion to be formed;
   first forming means having a downward movement for bending each lead downwardly to form a first lead segment forming an angle of between approximately 45 degrees and approximately a 90 degrees angle with the body;
   second forming means moving outwardly against each first lead segment for bending a portion of said first lead segment outwardly to form an approximately horizontal second lead segment;
   cutting means for moving vertically upwards to remove a predetermined portion of each of said second lead segments.
   a shaft;
   means for rotating said shaft;
   for each pair of leads disposed on opposite sides of the body, a cam attached to said shaft;
   for each pair of leads disposed on opposite sides of the body, an upper plate in contact with said respective cam;
   for each pair of leads disposed on opposite sides of the body, a lower plate biased upwardly;
   transfer means for removing the flatpack from said clamp means and for placing the flatpack between upper and said lower plates in such a way that each lead is held between said upper and said lower plates; and
   wherein continued rotation of said shaft rotates said cam allowing said upper plate to move upwardly in response to the bias applied to said lower plate, and wherein a plurality of rotational cycles of said flexes each lead to remove the set therein.

9. A flatpack preparation machine for forming and straightening the leads of a flatpack integrated circuit having a body and a plurality of leads extending therefrom, said flatpack preparation machine comprising:
   a base;
   a stop located on said base;
   means for placing the flatpack on said base;
   alignment means having two fingers;
   means for biasing said alignment means;
   means for bringing each one of said two fingers into contact with one of the two leads disposed on opposite sides of the body at one end of the body, so as to urge the two leads disposed on opposite sides of the body at the opposite end of the flatpack against said stop;
   lower clamp means;

first transport means for attaching to the flatpack body, for carrying the flatpack, and for releasing the flatpack onto said lower clamp means;

upper clamp means cooperating with said lower clamp means to clamp each lead proximate the body between the body and the lead portion to be formed;

first forming means having a downward movement for bending each lead downwardly to form a first lead segment forming an angle of between approximately 45 degrees and 90 degrees with the body;

second forming means moving outwardly against each first lead segment for bending a portion of said first lead segment outwardly to form an approximately horizontal second lead segment;

cutting means for moving vertically upwards to remove a predetermined portion of each of said second lead segments;

for each lead disposed on opposite sides of the body, a lower plate biased upwardly;

second transport means for attaching to the flatpack body, for carrying the flatpack, and for releasing the flatpack onto said lower plates;

a shaft;

means for rotating said shaft;

for each pair of leads disposed on opposite sides of the body, a cam attached to said shaft;

for each pair of leads disposed on opposite sides of the body, an upper plate in contact with said respective cam;

for each pair of leads disposed on opposite sides of the body, a lower plate biased upperwardly;

wherein the flatpack is placed between said upper and said lower plates in such a way that each lead is held between said upper and said lower plates;

wherein the rotation of said shaft rotates said cams and causes said upper plate to move downwardly against the bias applied to said lower plate, thereby flexing the lead; and wherein said cams are oriented to flex adjacent lead pairs 180 degrees out of phase; and wherein continued rotation of said shaft rotates said cam allowing said upper plate to move upwardly in response to the bias applied to said lower plate, and wherein a plurality of rotational cycles of said shaft flexes each lead to remove the set therein and planarize the plurality of leads.

10. An integrated circuit preparation machine for forming and straightening the leads of an integrated circuit having a body and a plurality of leads extending therefrom, said integrated circuit preparation machine comprising:

a base;

a stop located on said base;

means for placing the integrated circuit on said base;

alignment means having two fingers;

means for biasing said alignment means;

means for bringing each one of said two fingers into contact with one of the two leads disposed on opposite sides of the body at one end of the body, so as to urge the two leads disposed on opposite sides of the body at the opposite end of the flatpack against said stop;

lower clamp means;

first transport means for attaching to the body, for carrying the integrated circuit, and for releasing the integrated circuit onto said lower clamp means;

upper clamp means cooperating with said lower clamp means to clamp each lead proximate the body between the body and the lead portion to be formed;

first forming means having a downward movement for bending each lead downwardly to form a first lead segment forming an angle of between approximately 45 degrees and 90 degrees with the body;

second forming means moving outwardly against each first lead segment for bending a portion of said first lead segment outwardly to form an approximately horizontal second lead segment;

cutting means for moving vertically upwards to remove a predetermined portion of each of said second lead segments;

for each lead disposed on opposite sides of the body, a lower plate biased upwardly;

second transport means for attaching to the body, for carrying the integrated circuit, and for releasing the integrated circuit onto said lower plates;

a shaft;

means for rotating said shaft;

for each pair of leads disposed on opposite sides of the body, a cam attached to said shaft;

for each pair of leads disposed on opposite sides of the body, an upper plate in contact with said respective cam;

for each pair of leads disposed on opposite sides of the body, a lower plate biased upwardly;

wherein the integrated circuit is placed between said upper and said lower plates in such a way that each lead is held between said upper and said lower plates;

wherein the rotation of said shaft rotates said cams and causes said upper plate to move downwardly against the bias applied to said lower plate, thereby flexing the lead; and wherein said cams are oriented to flex adjacent lead pairs 180 degrees out of phase; and wherein continued rotation of said shaft rotates said cam allowing said upper plate to move upwardly in response to the bias applied to said lower plate, and wherein a plurality of rotational cycles of said shaft flexes each lead to remove the set therein and planarize the plurality of leads.

* * * * *